(12) United States Patent
Gu et al.

(10) Patent No.: US 11,610,972 B2
(45) Date of Patent: Mar. 21, 2023

(54) TECHNIQUE FOR REDUCING GATE INDUCED DRAIN LEAKAGE IN DRAM CELLS

(71) Applicant: Applied Materials, Inc., Santa Clara, CA (US)

(72) Inventors: Sipeng Gu, Clifton Park, NY (US); Qintao Zhang, Mt Kisco, NY (US)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 17/314,275

(22) Filed: May 7, 2021

(65) Prior Publication Data

US 2022/0359670 A1 Nov. 10, 2022

(51) Int. Cl.
*H01L 29/40* (2006.01)
*H01L 29/423* (2006.01)
*H01L 21/02* (2006.01)
*H01L 21/265* (2006.01)

(52) U.S. Cl.
CPC ...... *H01L 29/401* (2013.01); *H01L 21/02233* (2013.01); *H01L 21/26533* (2013.01); *H01L 29/4236* (2013.01)

(58) Field of Classification Search
CPC ......... H01L 21/02233; H01L 21/26533; H01L 29/4236; H01L 29/7825
See application file for complete search history.

(56) References Cited

U.S. PATENT DOCUMENTS

| | | |
|---|---|---|
| 5,684,317 A | 11/1997 | Hwang |
| 10,043,886 B2 | 8/2018 | Chang et al. |
| 2015/0214362 A1* | 7/2015 | Oh ........................ H01L 29/401 438/270 |
| 2015/0349073 A1* | 12/2015 | Kang ................ H01L 29/66795 257/330 |
| 2017/0069727 A1* | 3/2017 | Blanchard ......... H01L 29/42368 |
| 2021/0082767 A1* | 3/2021 | Kim .................... H01L 29/4236 |
| 2022/0044972 A1* | 2/2022 | Cheng ............... H01L 21/28211 |
| 2022/0223601 A1* | 7/2022 | Lin ..................... H01L 29/4236 |
| 2022/0238675 A1* | 7/2022 | Li ....................... H01L 29/4236 |
| 2022/0293722 A1* | 9/2022 | Won ................. H01L 29/42376 |

OTHER PUBLICATIONS

Fathipour et al., "Asymmetric Gate Oxide Thickness Technology for Reduction of Gate Induced Drain Leakage Current in Nanoscale Single Gate SOI MOSFET," 978-1-4244-2717 2008 IEEE, 4 pages.
Xie et al., "A 7nm FinFET Technology Featuring EUV Patterning and Dual Strained High Mobility Channels," Conference Paper Dec. 2016, DOI: 10.1109/IEDM.2016.7838334, 5 pages.

* cited by examiner

*Primary Examiner* — Joseph C. Nicely
(74) *Attorney, Agent, or Firm* — KDB Firm PLLC

(57) ABSTRACT

A method of forming a metal oxide semiconductor field effect transistor with improved gate-induced drain leakage performance, the method including providing a semiconductor substrate having a gate trench formed therein, performing an ion implantation process on upper portions of sidewalls of the gate trench to make the upper portions more susceptible to oxidation relative to non-implanted lower portions of the sidewalls, and performing an oxidation process on surfaces of the substrate, wherein the implanted upper portions of the sidewalls develop a thicker layer of oxidation relative to the non-implanted lower portions of the sidewalls.

11 Claims, 5 Drawing Sheets

TECHNIQUE FOR REDUCING GATE INDUCED DRAIN LEAKAGE IN DRAM CELLS

FIELD OF THE DISCLOSURE

Embodiments of the present disclosure relate to transistor processing techniques, and more particularly, to modulating gate oxide thicknesses in MOSFETs to reduce gate induced drain leakage.

BACKGROUND OF THE DISCLOSURE

Gate-induced drain leakage (GIDL) is a metal-oxide-semiconductor field-effect transistor (MOSFET) device parameter that can detrimentally affect the performance of a MOSFET, such as a transistor in a dynamic random-access memory (DRAM) cell. GIDL is caused by band-to-band tunneling in the portion of a gate of a MOSFET overlapping the drain region of the MOSFET. GIDL occurs when a high voltage is applied to the drain of a MOSFET with the gate grounded, resulting in the formation of a deep-depletion region in the substrate below the gate-to-drain overlap region. Electron-hole pairs are generated by the tunneling of valence band electrons into the conduction band and are collected by the drain and substrate.

GIDL can be improved (i.e., reduced) by providing a relatively thick gate oxide film where the gate of a MOSFET overlaps the drain. Current methods and techniques for achieving such increased film thicknesses are generally complex and cumbersome, and thus associated with significant additional manufacturing costs. A need thus exists for efficient, inexpensive processes for providing a relatively thick gate oxide film where the gate of a MOSFET overlaps the drain.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method of forming a metal oxide semiconductor field effect transistor (MOSFET) with improved gate-induced drain leakage (GIDL) performance in accordance with an exemplary embodiment of the present disclosure may include providing a semiconductor substrate having a gate trench formed therein, performing an ion implantation process on upper portions of sidewalls of the gate trench to make the upper portions more susceptible to oxidation relative to non-implanted lower portions of the sidewalls, and performing an oxidation process on surfaces of the substrate, wherein the implanted upper portions of the sidewalls develop a thicker layer of oxidation relative to the non-implanted lower portions of the sidewalls.

Another method of forming a MOSFET with improved GIDL performance in accordance with an exemplary embodiment of the present disclosure may include providing a semiconductor substrate having a first gate trench and a second gate trench formed therein, performing an ion implantation process on upper portions of sidewalls of the first and second gate trenches to make the upper portions more susceptible to oxidation relative to non-implanted lower portions of the sidewalls, the ion implantation process comprising directing an ion beam at the substrate at oblique angles in a range of 20 degrees to 65 degrees relative to a top surface of the substrate, performing an oxidation process on surfaces of the substrate via one of in-situ steam generation, rapid thermal oxidation, atomic layer deposition, physical vapor deposition, and chemical vapor deposition, wherein the implanted upper portions of the sidewalls develop a thicker layer of oxidation relative to the non-implanted lower portions of the sidewalls, and depositing work function metal layers in the first and second gate trenches.

Another method of forming a MOSFET with improved GIDL performance in accordance with an exemplary embodiment of the present disclosure may include providing a semiconductor substrate having a gate trench formed therein, the gate trench having a source side sidewall, an opposing drain side sidewall, and a floor, performing an ion implantation process on an upper portion of the drain side sidewall of the gate trench to make the upper portion more susceptible to oxidation relative to the non-implanted source side sidewall, floor, and lower portion of the drain side sidewall, and performing an oxidation process on surfaces of the substrate, wherein the implanted upper portion of the drain side sidewall develops a thicker layer of oxidation relative to the non-implanted source side sidewall, floor, and lower portion of the drain side sidewall.

BRIEF DESCRIPTION OF THE DRAWINGS

By way of example, various embodiments of the disclosed techniques will now be described with reference to the accompanying drawings, wherein.

DETAILED DESCRIPTION

Figure 1A:
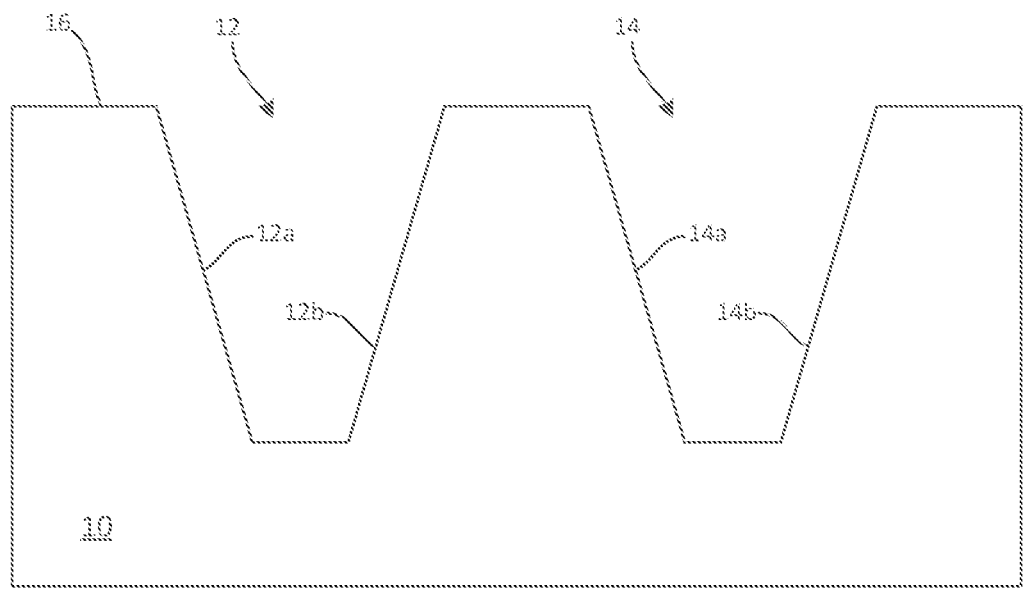
FIGS. 1A-1H are a series of cross-sectional views illustrating a method of producing MOSFETs having relatively thick gate oxide films formed on gate-to-drain and/or gate-to-source overlap regions thereof in accordance with exemplary embodiments of the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

The present embodiments provide novel techniques for forming Metal-Oxide-Semiconductor Field-Effect Transistors (MOSFETs), and in particular novel techniques for forming MOSFETs with improved gate-induced drain leakage (GIDL) performance. MOSFETs produced using the techniques described herein may be beneficial in the manufacture of transistors used in dynamic random-access memory (DRAM) cells, for example, wherein the reduction of GIDL is of particular importance. The present disclosure is not limited in this regard.

Referring to FIGS. 1A-1H, a series of cross-sectional views illustrating an exemplary process for producing MOSFETs having relatively thick gate oxide films formed on gate-to-source and gate-to-drain overlap regions thereof is shown. Referring to FIG. 2, a flow diagram summarizing the exemplary processes illustrated in FIGS. 1A-1H is provided. For the sake of convenience and clarity, terms such as "top," "bottom," "upper," "lower," "vertical," "horizontal," "lateral," and "longitudinal," may be used herein to describe the relative position and orientation of various structures, all with respect to the geometry and orientation of the structures as they appear in the views shown in FIGS. 1A-1F. Said terminology is not intended to be limiting and includes the words specifically mentioned, derivatives thereof, and words of similar import.

Figure 2:
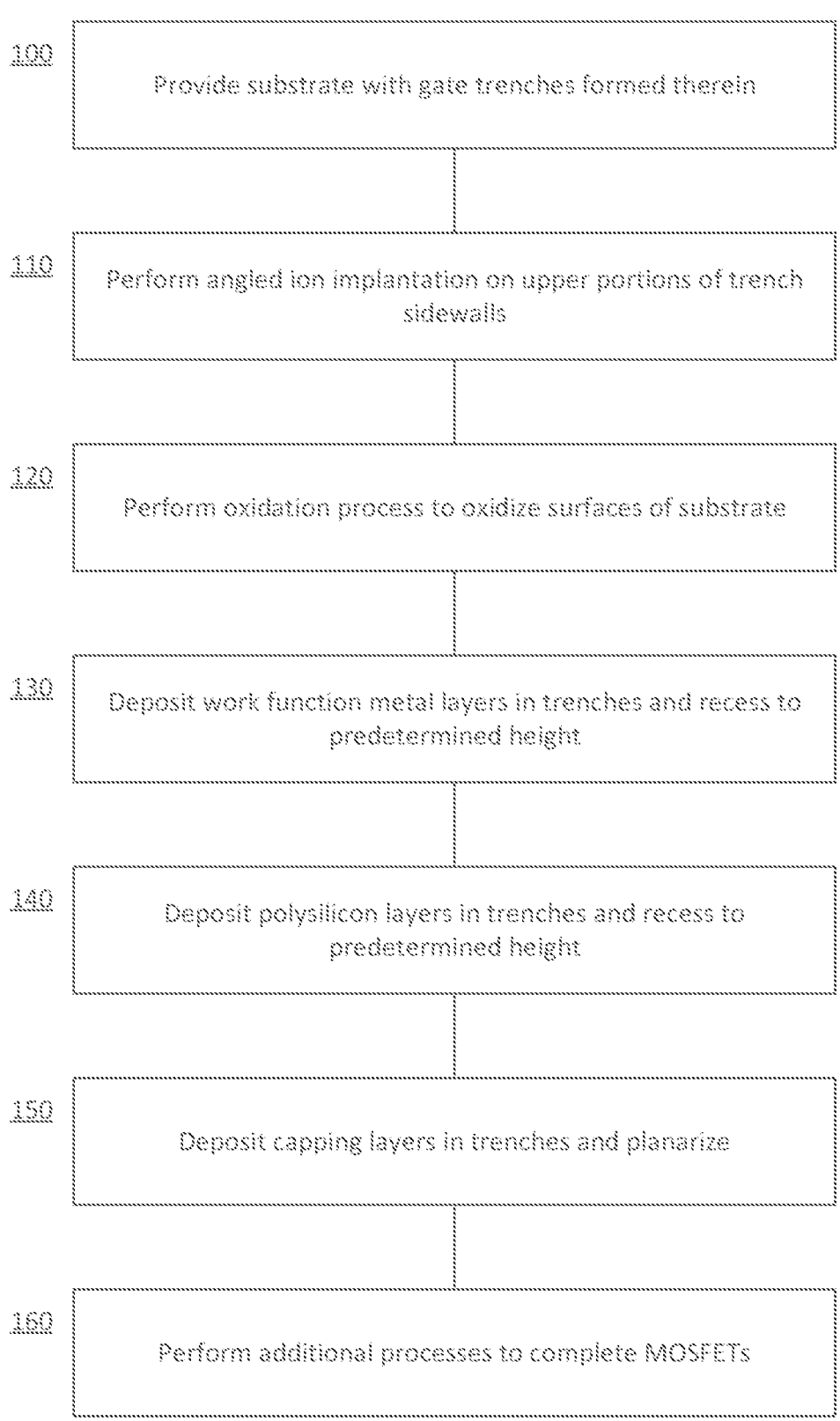
FIG. 2 is a flow diagram summarizing the processes shown in FIGS. 1A-1F.

Referring to FIG. 1A and block 100 in FIG. 2, a semiconductor substrate 10 (hereinafter "the substrate 10") may be provided. The substrate 10 may have one or more trenches formed therein, e.g., horizontally adjacent, spaced-apart trenches 12, 14. The trenches 12, 14, hereinafter referred to as "the first gate trench 12" and "the second gate trench 14," may have angled sidewalls 12a, 12b and 14a, 14b (i.e., angled relative to a top surface 16 of the substrate) providing the first gate trench 12 and the second gate trench 14 with tapered, generally V-shaped profiles as shown. For the purposes of the following description, the first gate trench 12 and the second gate trench 14 provide the basis for two adjacent MOSFETs having respective sources of the left sides of the first gate trench 12 and the second gate trench 14 and having respective drains on the right sides of the first gate trench 12 and the second gate trench 14. Thus, the left-side sidewalls 12a, 14a may be referred to herein as "the source side sidewalls 12a, 14a," and the right-side sidewalls 12b, 14b may be referred to herein as "the drain side sidewalls 12a, 14a." In various alternative embodiments, the first gate trench 12 and the second gate trench 14 may provide the basis for two adjacent MOSFETs having a shared drain located between the first gate trench 12 and the second gate trench 14, a first source on the left side of the first gate trench 12, and a second source on the right side of the second gate trench 14 (as in a conventional DRAM transistor structure). In other alternative embodiments, the first gate trench 12 and the second gate trench 14 may provide the basis for two adjacent MOSFETs having a shared source located between the first gate trench 12 and the second gate trench 14, a first drain on the left side of the first gate trench 12, and a second drain on the right side of the second gate trench 14. The present disclosure is not limited in this regard.

In various embodiments, the tops of the first gate trench 12 and the second gate trench 14 may have widths in a range of 30 nm to 60 nm, and the bottoms of the first gate trench 12 and the second gate trench 14 may have widths in a range of 10 nm to 40 nm. The present disclosure is not limited in this regard. The substrate 10 may be formed of any suitable semiconductor material, including, and not limited to, silicon (e.g., crystalline silicon), germanium, silicon carbide, gallium arsenide, gallium nitride, etc.

Figure 1B:
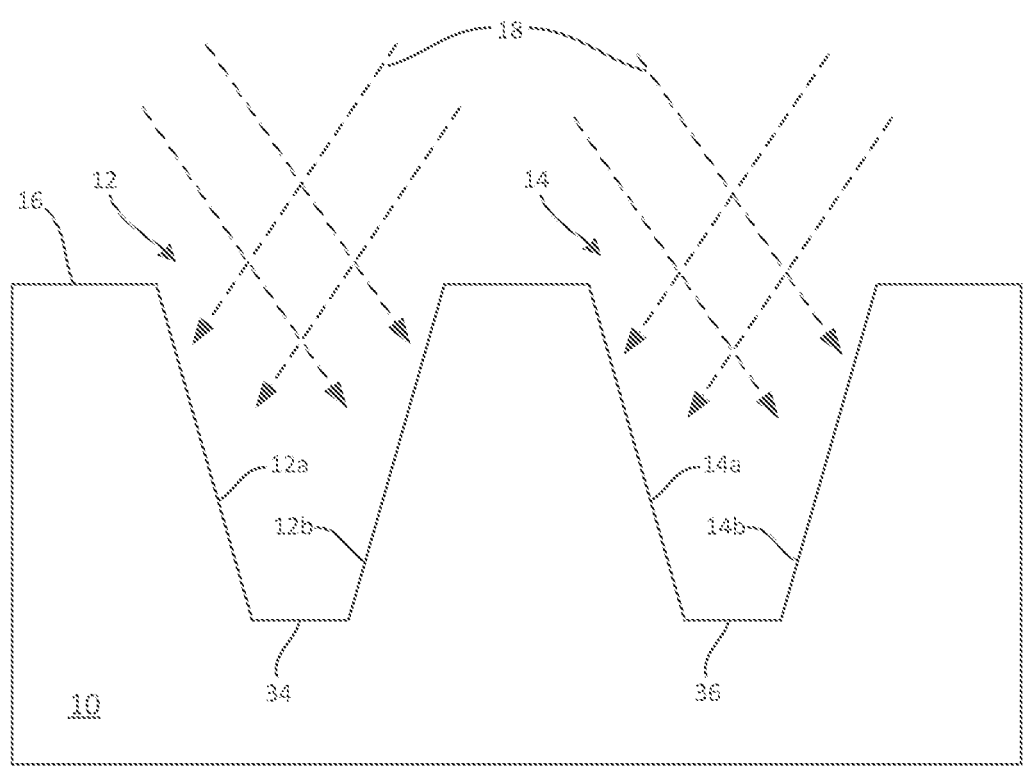

Referring to FIG. 1B and block 110 in FIG. 2, an ion implantation process may be performed on the substrate 10, wherein an ion beam 18 formed of an ionized dopant species may be directed at the substrate 10 at oblique angles relative to the top surface 16 of the substrate 10. For example, the source of the ion beam 18 may be tilted relative to the substrate 10 (e.g., 20 degrees to 65 degrees), or the substrate 10 may be tilted relative to the source of the ion beam 18 to achieve the desired angles of implantation. As shown, the ion beam 18 may be directed at the substrate 10 in two opposing directions (e.g., right-to-left and left-to-right). This may be achieved by performing two sequential exposures, wherein one ion beam source (not shown) is repositioned relative to the substrate 10 between exposures, or by implementing two ion beam sources facing opposing directions. The present disclosure is not limited in this regard.

Thus, the ion beam 18 may impinge on the top surface 16 of the substrate 10 as well as on upper portions of the sidewalls 12a, 12b and 14a, 14b of the first gate trench 12 and the second gate trench 14, while lower portions of the sidewalls 12a, 12b and 14a, 14b and floors 34, 36 of the first gate trench 12 and the second gate trench 14 are shielded from the ion beam 18. The dopant species transmitted in the ion beam 18 may be selected to make the implanted surfaces of the substrate 10 more susceptible to oxidation relative to the non-implanted surfaces of the substrate 10. More specifically, the implanted top surface 16 of the substrate 10 and upper portions of the sidewalls 12a, 12b and 14a, 14b may become more susceptible to oxidation than the lower portions of the sidewalls 12a, 12b and 14a, 14b and floors 34, 36. In various examples, the dopant species may be one or more of germanium, phosphorus, arsenic, boron, gallium, antimony, etc. The present disclosure is not limited in this regard.

Figure 1C:
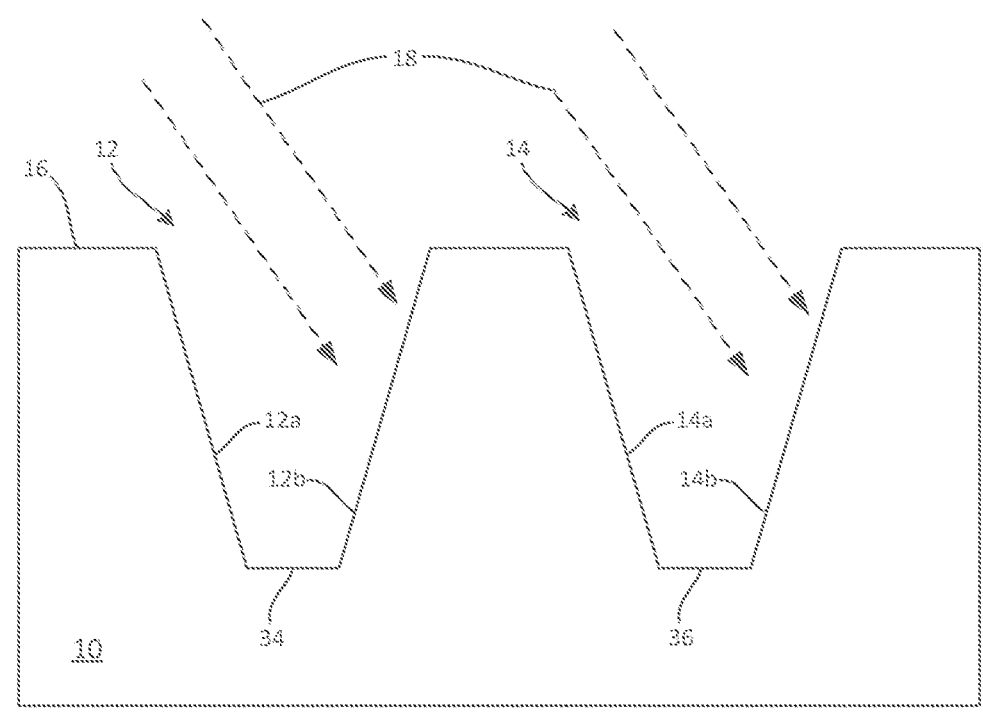

While the ion implantation process of FIG. 1B has been shown and described as being performed on the top surface 16 of the substrate 10 and upper portions of all of the sidewalls 12a, 12b and 14a, 14b of the first gate trench 12 and the second gate trench 14, alternative embodiments of the present disclosure are contemplated wherein the upper portions of the drain side sidewalls 12b, 14b are implanted while the upper portions of the source side sidewalls 12a, 12b are not implanted as shown in FIG. 1C. Thus, above described ion implantation is performed in one tilted direction instead of two.

Figure 1D:
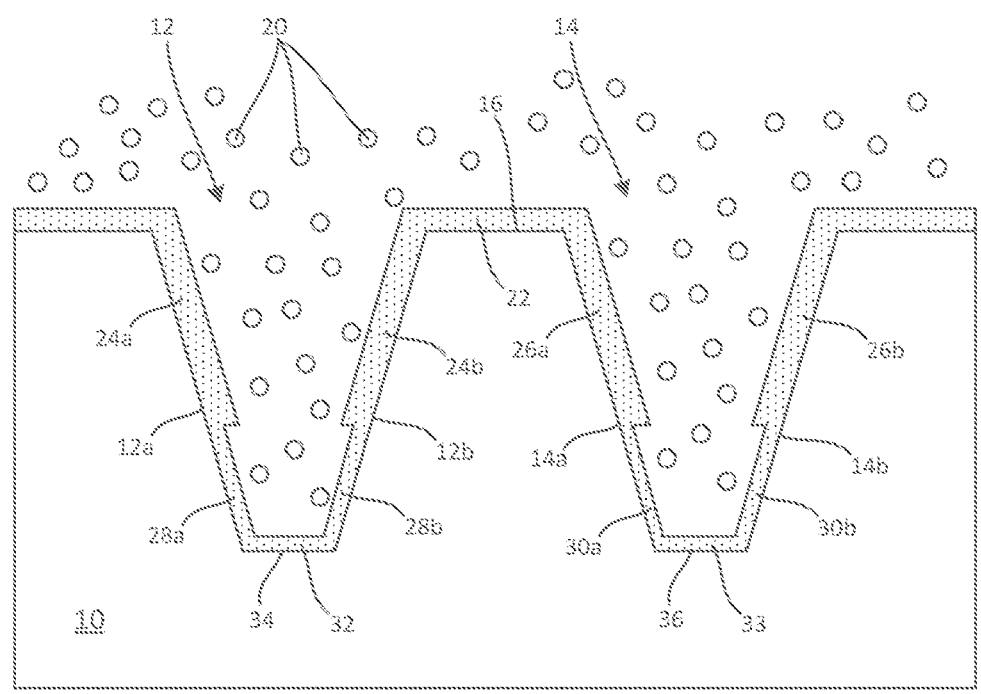

Referring to FIG. 1D and block 120 in FIG. 2, an oxidation process may be performed wherein thermal or ionized oxygen atoms 20 may react with the substrate 10 or be deposited on the substrate 10 to oxidize surfaces thereof, including the top surface 16, the sidewalls 12a, 12b of the first gate trench 12, and the sidewalls 14a, 14b of the second gate trench 14. Such deposition may be achieved using various deposition processes familiar to those of ordinary skill in the art, including, and not limited to, in-situ steam generation (ISSG), rapid thermal oxidation (RTO), atomic layer deposition (ALD), physical vapor deposition (PVD), and chemical vapor deposition (CVD). The present disclosure is not limited in this regard.

Figure 1E:
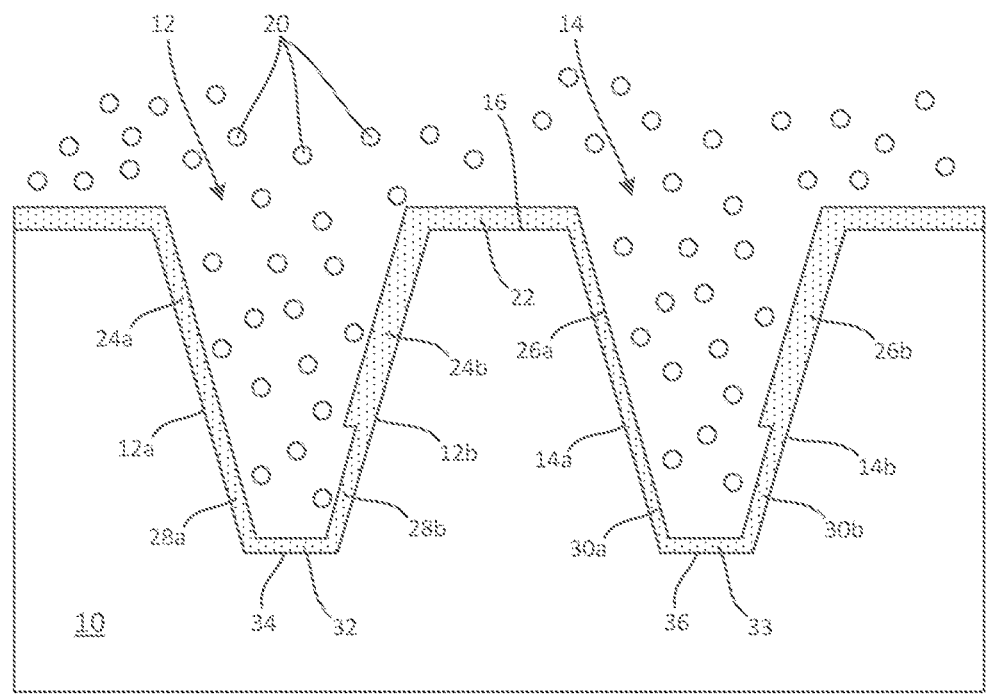

Owning to the ion implantation process previously performed on the top surface 16 of the substrate 10 and upper portions of the sidewalls 12a, 12b and 14a, 14b (as described above and as illustrated in FIG. 1B), the top surface 16 of the substrate 10 and upper portions of the sidewalls 12a, 12b and 14a, 14b may be more susceptible to oxidation than the lower portions of the sidewalls 12a, 12b and 14a, 14b. Thus, as the various surfaces of the substrate 10 are oxidized, the top surface 16 of the substrate 10 and upper portions of the sidewalls 12a, 12b and 14a, 14b may oxidize more rapidly than the lower portions of the sidewalls 12a, 12b and 14a, resulting in the formation of oxidation layers 22, 24a, 24b, and 26a, 26b on the top surface 16 of the substrate 10 and upper portions of the sidewalls 12a, 12b and 14a, 14b thicker than oxidation layers 28a, 28b, 30a, 30b, 32, and 33 formed on the lower portions of the sidewalls 12a, 12b and 14a, 14b and floors 34, 36 of the first gate trench 12 and the second gate trench 14, respectively. Of course, if the above-described ion implantation process was performed on the drain side sidewalls 12b, 14b and not on the source side sidewalls 12a, 14a (see FIG. 1C), the thicker oxidation layers will form on the drain side sidewalls 12b, 14b and not on the source side sidewalls 12a, 14a as shown in FIG. 1E.

Figure 1F:
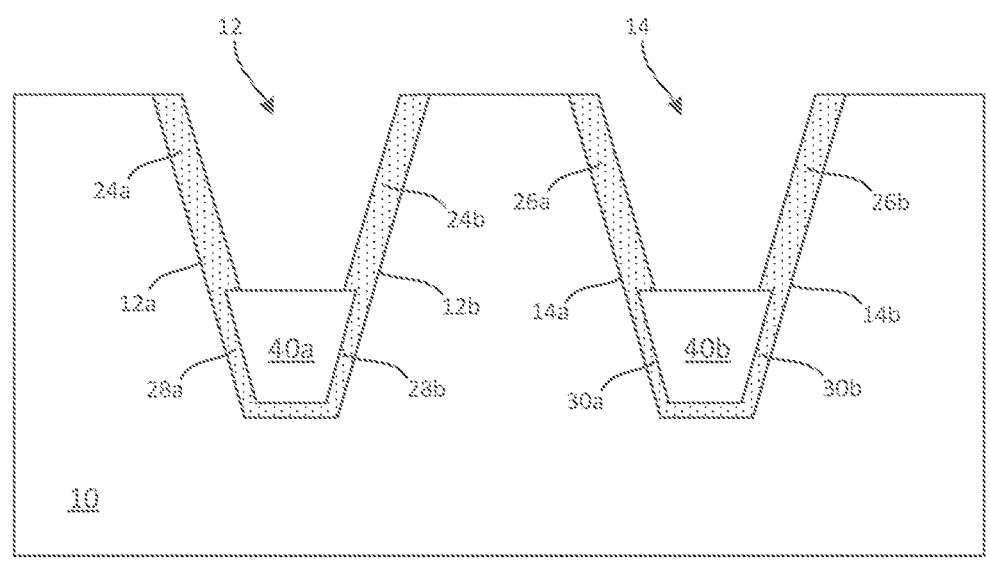

Referring to FIG. 1F and block 130 in FIG. 2, work function metal layers 40a, 40b may be deposited within the first gate trench 12 and the second gate trench 14, respectively. The work function metal layers 40a, 40b may be formed of a transition metal nitride compound, such as TiN, TiAlC, or TiC, for example. Deposition may be achieved using physical vapor deposition, chemical vapor deposition, atomic layer deposition, etc. The present disclosure is not limited in this regard. After the first gate trench 12 and the second gate trench 14 are partially or entirely filled with the work function metal layers 40a, 40b a recessing or chamfering process may be performed wherein the work function metal layers 40a, 40b are etched back to a predetermined height within the trenches. For example, the work function metal layers 40a, 40b may be etched back to the heights of the lowermost edges of the thicker oxidation layers 24a, 24b, and 26a, 26b on the upper portions of the sidewalls 12a, 12b and 14a, 14b as shown in FIG. 1F. The present disclosure is not limited in this regard. The recessing or chamfering may be achieved using any of a wet etching, dry etching, or an ion etching process, for example.

Figure 1G:
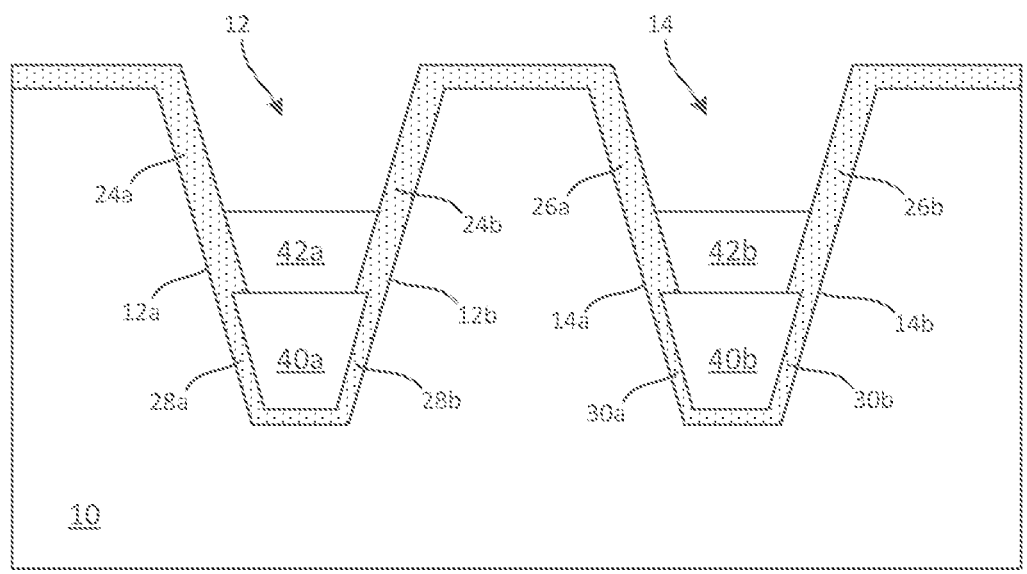

Referring to FIG. 1G and block 140 in FIG. 2, polysilicon layers 42a, 42b may be deposited within the first gate trench 12 and the second gate trench 14 atop the work function metal layers 40a, 40b, respectively. Deposition may be achieved using physical vapor deposition, chemical vapor deposition, atomic layer deposition, etc. The present disclosure is not limited in this regard. After the polysilicon layers 42a, 42b have been deposited, a recessing or chamfering process may be performed wherein the polysilicon layers 42a, 42b are etched back to a predetermined height within the trenches. For example, the polysilicon layers 42a, 42b may be etched back to a height above the lowermost edges of the thicker oxidation layers 24a, 24b, and 26a, 26b on the upper portions of the sidewalls 12a, 12b and 14a, 14b and below the tops of trenches as shown in FIG. 1G. The present disclosure is not limited in this regard. The recessing or chamfering may be achieved using any of a wet etching process, a dry etching process, or an ion etching process, for example. In various embodiments of the present disclosure, the polysilicon layers 42a, 42b and the associated recessing process may be entirely omitted.

Figure 1H:
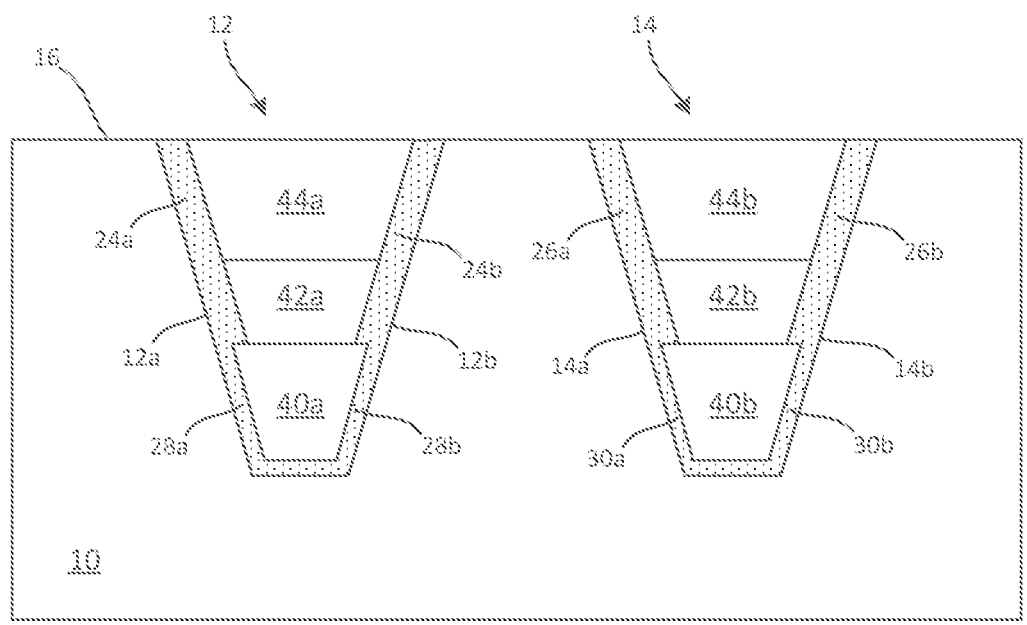

Referring to FIG. 1H and block 150 in FIG. 2, capping layers 44a, 44b may be deposited within the first gate trench 12 and the second gate trench 14 atop the polysilicon layers 42a, 42b, respectively. The capping layers 44a, 44b may be formed of any suitable capping material familiar to those of ordinary skill in the art, such as SiN, SiCN, SiC, SiON, for example. Deposition may be achieved using physical vapor deposition, chemical vapor deposition, atomic layer deposition, etc. The present disclosure is not limited in this regard. After the capping layers 44a, 44b have been deposited, a planarization process may be performed wherein the capping layers 44a, 44b are removed to a predetermined height. For example, the capping layers 44a, 44b may be polished back to make the top surfaces of the capping layers 44a, 44b coplanar with the top surface 16 of the substrate 10 as shown in FIG. 1H. The present disclosure is not limited in this regard. The planarization may be achieved using any of a chemical mechanical planarization process, a mechanical polishing process, a dry etching, or an ion etching process, for example.

Referring to block 160 in FIG. 2, additional processes may be performed on the substrate 10, the first gate trench 12, and the second gate trench 14 to produce complete transistor devices (e.g., a DRAM cell). These processes may include the formation of source and drain terminals adjacent the first and second gate trenches 12, 14, for example. Such processes will be familiar to those of ordinary skill in the art and will thus not be described in further detail herein.

The exemplary method described above and illustrated in FIGS. 1A-1H and FIG. 2 may produce a MOSFET having relatively thick gate oxide films formed on gate-to-drain and/or gate-to-source overlap regions thereof, thus providing several advantages in the art. For example, GIDL may be improved (i.e., reduced) in the completed MOSFETs, thus improving the performance of a device (e.g., a DRAM cell) incorporating the MOSFETs. Additionally, the method illustrated in FIGS. 1A-1H and FIG. 2 may be incorporated into existing MOSFET manufacturing processes conveniently and at relatively low cost, resulting in a relatively low impact on the manufacturing cost of MOSFETs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of forming a metal oxide semiconductor field effect transistor, the method comprising:
   providing a semiconductor substrate having a gate trench formed therein;
   performing an ion implantation process on upper portions of sidewalls of the gate trench to make the upper portions more susceptible to oxidation relative to non-implanted lower portions of the sidewalls;
   performing an oxidation process on surfaces of the substrate, wherein the implanted upper portions of the sidewalls develop a thicker layer of oxidation relative to the non-implanted lower portions of the sidewalls;
   depositing a work function metal layer in the gate trench; and depositing a polysilicon layer directly on top of the work function metal layer.

2. The method of claim 1, wherein the ion implantation process comprises directing an ion beam at the substrate at oblique angles relative to a top surface of the substrate.

3. The method of claim 2, wherein the oblique angles are in a range of 20 degrees to 65 degrees.

4. The method of claim 2, wherein the ion beam is directed at the substrate in two opposing directions.

5. The method of claim 1, wherein the work function metal layer is formed of one of TiN, TiAlC, are TiC.

6. The method of claim 5, further comprising recessing the work function metal layer to a predetermined height.

7. The method of claim 1, further comprising recessing the polysilicon layer to a predetermined height.

8. The method of claim 1, further comprising depositing a capping layer in the gate trench.

9. The method of claim 8, further comprising performing a planarization process on the capping layer.

10. The method of claim 1, wherein the oxidation process comprises one of in-situ steam generation, rapid thermal oxidation, atomic layer deposition, physical vapor deposition, and chemical vapor deposition.

11. A method of forming metal oxide semiconductor field effect transistors, the method comprising:
provided a semiconductor substrate having a first gate trench and a second gate trench formed therein;
performing an ion implantation process on upper portions of sidewalls of the first and second gate trenches to make the upper portions more susceptible to oxidation relative to non-implanted lower portions of the sidewalls, the ion implantation process comprising directing an ion beam at the substrate at oblique angles in a range of 20 degrees to 65 degrees relative to a top surface of the substrate;
performing an oxidation process on surfaces of the substrate via one of in-situ steam generation, rapid thermal oxidation, atomic layer deposition, physical vapor deposition, and chemical vapor deposition, wherein the implanted upper portions of the sidewalls develop a thicker layer of oxidation relative to the non-implanted lower portions of the sidewalls;
depositing work function metal layers in the first and second gate trenches; and
depositing polysilicon layers directly on top of the work function metal layers.

* * * * *